United States Patent [19]
Kline et al.

[11] Patent Number: 5,444,632
[45] Date of Patent: Aug. 22, 1995

[54] APPARATUS AND METHOD FOR CONTROLLING AND SCHEDULING PROCESSING MACHINES

[75] Inventors: Paul J. Kline, Richardson; Michael A. Kilgore, McKinney, both of Tex.; Cynthia C. Martin, Charlotte, N.C.

[73] Assignee: Texas Instruments Incorporated, Dallas, Tex.

[21] Appl. No.: 234,072

[22] Filed: Apr. 28, 1994

[51] Int. Cl.⁶ .............................................. G06F 19/00
[52] U.S. Cl. ...................................... 364/468; 364/401
[58] Field of Search .................................. 364/401–403, 364/468, 478; 395/650, 904, 906, 912, 914, 919, 926

[56] References Cited

U.S. PATENT DOCUMENTS

| | | | |
|---|---|---|---|
| 4,796,194 | 1/1989 | Atherton | 364/468 |
| 5,053,970 | 10/1991 | Kurihara et al. | 364/468 |
| 5,140,537 | 8/1992 | Tullis | 364/401 |
| 5,148,370 | 9/1992 | Litt et al. | 364/468 |
| 5,212,791 | 5/1993 | Damian et al. | 395/650 |
| 5,260,868 | 11/1993 | Gupta et al. | 364/402 |
| 5,285,494 | 2/1994 | Sprecher et al. | |

OTHER PUBLICATIONS

Paul J. Kline, *Scheduling Revisited Workstations in Integrated-Circuit Fabrication*, 1992 Spring Symposium Series, Practical Approaches to Scheduling and Planning, Stanford University, Mar. 25–27, 1992 pp. 102–106.

Norman Sadeh, *Look-Ahead Techniques for Micro-Opportunistic Job Shop Scheduling*, PHD Thesis, CMU-CS-91-102, School of Computer Science, Carnegie Mellon University, Mar. 1991.

D. P. Clancy and S. Mohan, *RBD-Rule Based Job Dispatching Software for Implementing Production Plans*, First Inter. Conference on Expert Planning Systems, Brighton, UK, 1990 pp. 101–103.

Primary Examiner—Roy N. Envall, Jr.
Assistant Examiner—Steven R. Garland
Attorney, Agent, or Firm—W. Daniel Swayze, Jr.; W. James Brady, III; Richard L. Donaldson

[57] ABSTRACT

A method and apparatus selects a period of time for evaluating process resources and lots to be processed by the process resources. Selected lots and selected process resource are chosen that are available to be processed by the process resource and that are available to process the selected lots respectively. For each of the combination of selected process and selected lots a tool score and a lot score is determine and combined in order to select a winning score. The factory is controlled through the process resource in accordance with the winning score.

18 Claims, 8 Drawing Sheets

APPARATUS AND METHOD FOR CONTROLLING AND SCHEDULING PROCESSING MACHINES

TECHNICAL FIELD OF THE INVENTION

This present invention relates to an apparatus and a method for modeling thru scheduling and control of distributed factories which have fabrication sequences. The invention further relates to a Computer Integrated Manufacturing (CIM) System that includes a factory model for automatic control of the CIM systems.

BACKGROUND OF THE INVENTION

Most manufacturing plants or factories are distributed in that they include heterogeneous, unconnected workstations. The virtue of this factory design is that it provides adaptability to a varying product mix. The drawback is the resulting complexity of operations, management and quality control.

A distributed manufacturing plant fabricates a variety of products through a sequence of process steps. Each process step can be performed by at least one workstation in the factory. Distributed factories are common in the manufacture of modern electronics products. For example, six types of distributed factories may be involved: wafer slicing, wafer fabrication, semiconductor-component assembly, circuit-board fabrication, circuit-board assembly and electronic-product assembly.

The archetype of a distributed factory is a wafer-fabrication plant or "wafer fab", which many manufactured products are simultaneously produced according to over 1000 processes, averaging approximately 150 steps each. Such a large collection of processes is difficult to represent in a drawing like a fab graph. Such a factory, however, can be described conveniently to a computer system.

The complexity of distributed factories is further illustrated by the existence of tens of thousands of fabrication sequences in a general class of distributed factories called a "job shop". The standard approach to describing the collection of sequences in a job shop is to surrender to the complexity of the job shop and describe the product path through the factory is being random. The product pass is clearly not random, but only recently have computers provided the practical computational power to describe highly-complex factories accurately.

The factory is a complex, data-and-information-rich entity. A data structure with tens of thousands of parameters may be required to merely describe the factory. Furthermore, in operation, a dynamic factory produces an order of magnitude more data than the parameter data structure to describe the production flows. The sheer volume of information has made operation and control of a distributed factory a major problem.

Shop-floor schedulers have a very limited function. They attempt to pick the next lot or lots to process at a workstation. The choice typically depends heavily on the due date of the lot and processing time remaining in order to complete the lot. In general lots which are most behind schedule are given priority, and all lots in the queue must be ranked according to this priority function. The location of lots and queues come from production tracking system. The world is filled with real factories that operate, however, suboptimally, as a result of where theory has failed to provide exact solutions, through thousands of ad-hock decisions made on the factory floor. Thus, there exists a substantial need for improvement through modeling and control techniques so that these factories can be of more practical use and operated more efficiently.

Both scheduling theory and shop loading schemes possess two major structural faults. First, they are incapable of recognizing the details of the individual factories and as a consequence or incapable of responding to these details. In practical scheduling problems, details of operation often determines success or failure in terms of efficiency. Secondly, both methodologies neglect the dynamic operation of the factory. Unfortunately, it is precisely through the consideration of operational dynamics that human factory managers achieve scheduling solutions.

One conventional approach to the above-described problems is the use of predictive scheduler. However, such a predictive scheduler may become obsolete, yielding inefficient or inaccurate results, when lots are placed on hold or machines fail. Under such circumstances, it is necessary to reschedule the machines and lots to accommodate these unexpected events. One approach to deal with these problems is simply to flush or eliminate from the schedule the affected lots and reschedule these lots at a later time.

Another technique for wafer fab scheduling is the use of dispatch rules. Examples of dispatch rules are first-in-first-out (FIFO) and shortest processing time. However, one defect of these approaches is that these approaches suffer from the defect that a machine may become free before making any decisions with respect to subsequent loading on that machine. This leads to inefficiency and a finite period of time may occur before any decision with respect to this machine can be made.

Another defect of dispatch rules is that there may be time constraints between process steps; for example, no more than 30 minutes may elapse between a clean operation and a subsequent deposition operation.

One way of solving this problem is to adopt a "look before you leap" approach by checking to see if these constraints are satisfied in the schedule before executing the first step of the process. However, this look before you leap approach is not an option for a pure dispatch rule.

For a predictive scheduler, automatic rescheduling is an active area of scheduling research as the following United State Patents illustrate.

U.S. Pat. No. 4,796,194 to Atherton discloses a modeling an control processes for distributed factories having fabrication sequences starting with a definition of how the factory actually operates, rather than mathematical theory which ultimately leads to definition of the plant operations.

U.S. Pat. No. 4,956,784 to Hadavi discloses a method for controlling the release of jobs from a pool of pending jobs into a factory, which includes a plurality of machines processing jobs-in-progress.

U.S. Pat. No. 5,170,355 to Hadavi discloses a method for controlling the release of jobs from a pool of pending jobs into a factory which includes a plurality of machines processing jobs in progress.

SUMMARY OF THE INVENTION

The present invention discloses a scheduler for making the scheduling choices required to fabricate lots of manufactured items according to a sequence of fabrication operations. The present invention schedules a predefined amount of time into the future for each lot and each process resource. For each lot, sufficient operations in its upcoming processing sequence are scheduled to cover the predetermined time horizon. For each process resource, sufficient lots are scheduled for processing on that resource to cover the predetermined time horizon. Time within the time horizon is left unscheduled only when contention for resources prevents processing for lots or process resources. To determine which lot to schedule next for a process resource, an evaluation is made of each pair from a set of selected lots and a set of selected process resources. The selected lots include all lots that will be waiting for a particular fabrication operation as well as lots expected to need the operation within a designated time window. The selected process resources include all of the process resources capable of performing the required operations. A combination of a selected lot with a selected resource is evaluated in terms of a number of factors. A critical path method analysis for a single processing step is made for each combined pair which makes it possible to evaluate the step cycle time and machine idleness implications of this pairing. The evaluation assigns scores to each factor and combines these to obtain a score for each pairing of a lot and process resource. The pair with the best score determines which lot will be processed on which process resource in the factory.

DETAILED DESCRIPTION OF THE INVENTION

The present invention and its advantages are understood by referring to FIGS. 1–14 of the drawings, like numerals being used for like corresponding parts of the various drawings.

The scheduler module 110 schedules lots to be processed, considering factors, for example, other lots and process resources or tools and the critical path analysis of each lot on each process resource.

Figure 1:
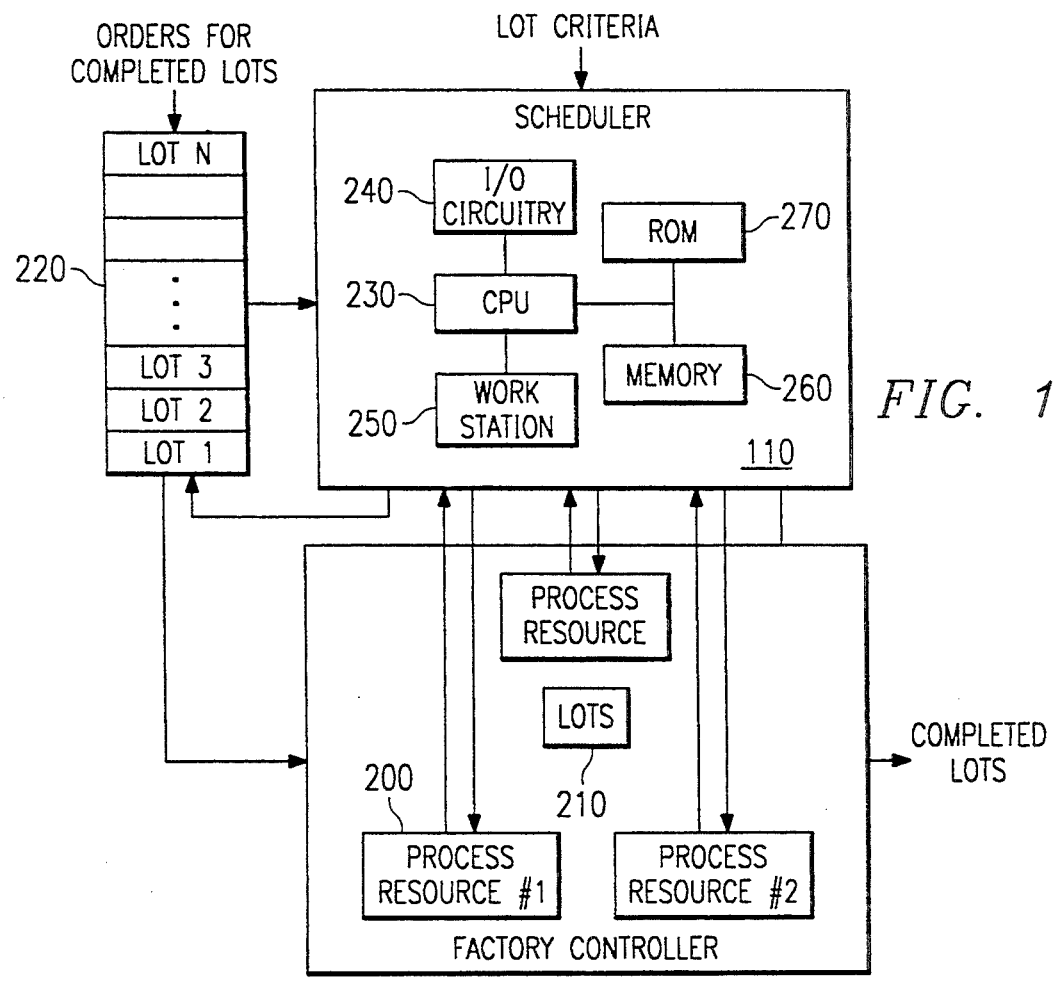
FIG. 1 is a diagram of the list of orders to be processed, the scheduler and the factory of the present invention.
Figure 2:
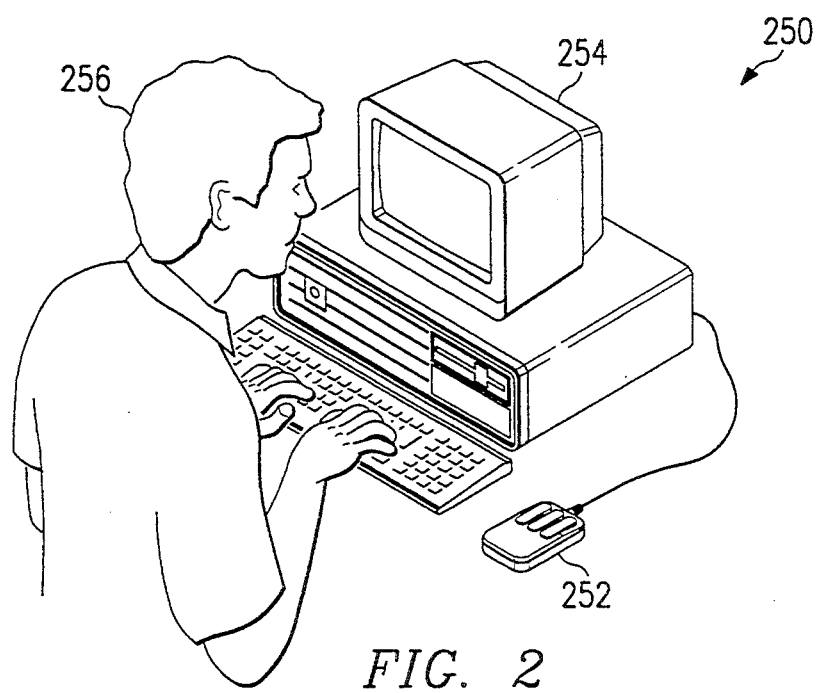
FIG. 2 illustrates a workstation of the present invention.

FIG. 1 illustrates that lot criteria are input to the scheduler module 110. The scheduler module 110 includes workstation 250 as illustrated in FIG. 2, input and output (I/O) circuitry 240 to input and output from the scheduler module 110, the factory module 201 and a database 220 of a list of orders to be completed, a memory 260 to store data and a ROM 270 to form circuits from the software, for example firmware. The scheduler module 110 is connected to the factory 201 and the list of orders for lots to be completed. The scheduler module 110 controls the process resources 200 of the factory 201 such that lots 210 are scheduled and committed to be processed by the appropriate process resource 200 during the appropriate time interval. The scheduler module 110 additionally transmits release data to the list of orders 220 so that lots may be released into the factory 200 from a queue. Additionally, the list of orders 220 transmits lot data to the scheduler so that the scheduler 110 can evaluate the lot data and schedule and control the various lots 210 within the factory.

In FIG. 2, the user 256 inputs and receives scheduling information to workstation 250 having a monochrome or color monitor 254 through a keyboard 258 and 252 mouse. The workstation 250 is connected to the scheduler module 110 through a network in order to share the information stored in memory 260 with a plurality of users.

Figure 3:
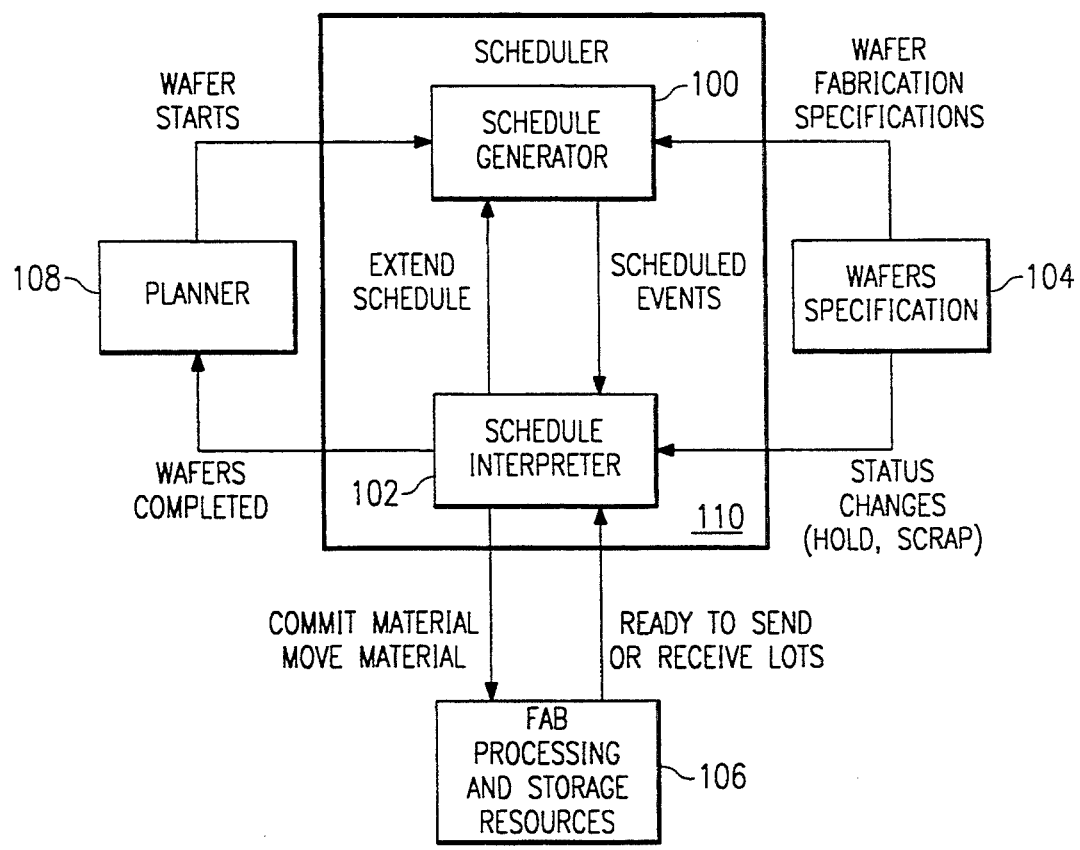
FIG. 3 illustrates scheduler module, planner module, specification module and factory module of the present invention.

FIG. 3 illustrates the schedule generator module 100 and the schedule interpreter module 102 of the scheduler 110. The scheduler module 110 is connected to a planner module 108 in order to receive planned release times for the lots to enter the factory 200. Additionally, the scheduler module 110 is connected to the wafer specification module 104 in order to receive data, for example, the sequence of steps, for example pattern, etch, deposit, etc. for the lot in the factory in terms of various process resources in order to transform for example the raw unprocessed wafers into completed wafers. The scheduler module 110 is connected to the factory module 106 in order to communicate to and control the factory 106 so that lots may be committed to particular process resources or to provide data corresponding to the process resource, for example, a process resource is able to receive lots for processing. Object-oriented programming, for example, smalltalk-80 language facilitates communication between dynamic objects which interact by sending messages to each other. These messages may correspond to procedure calls. The scheduler module 110 includes objects in order to schedule each lot and each process resource.

Figure 4:
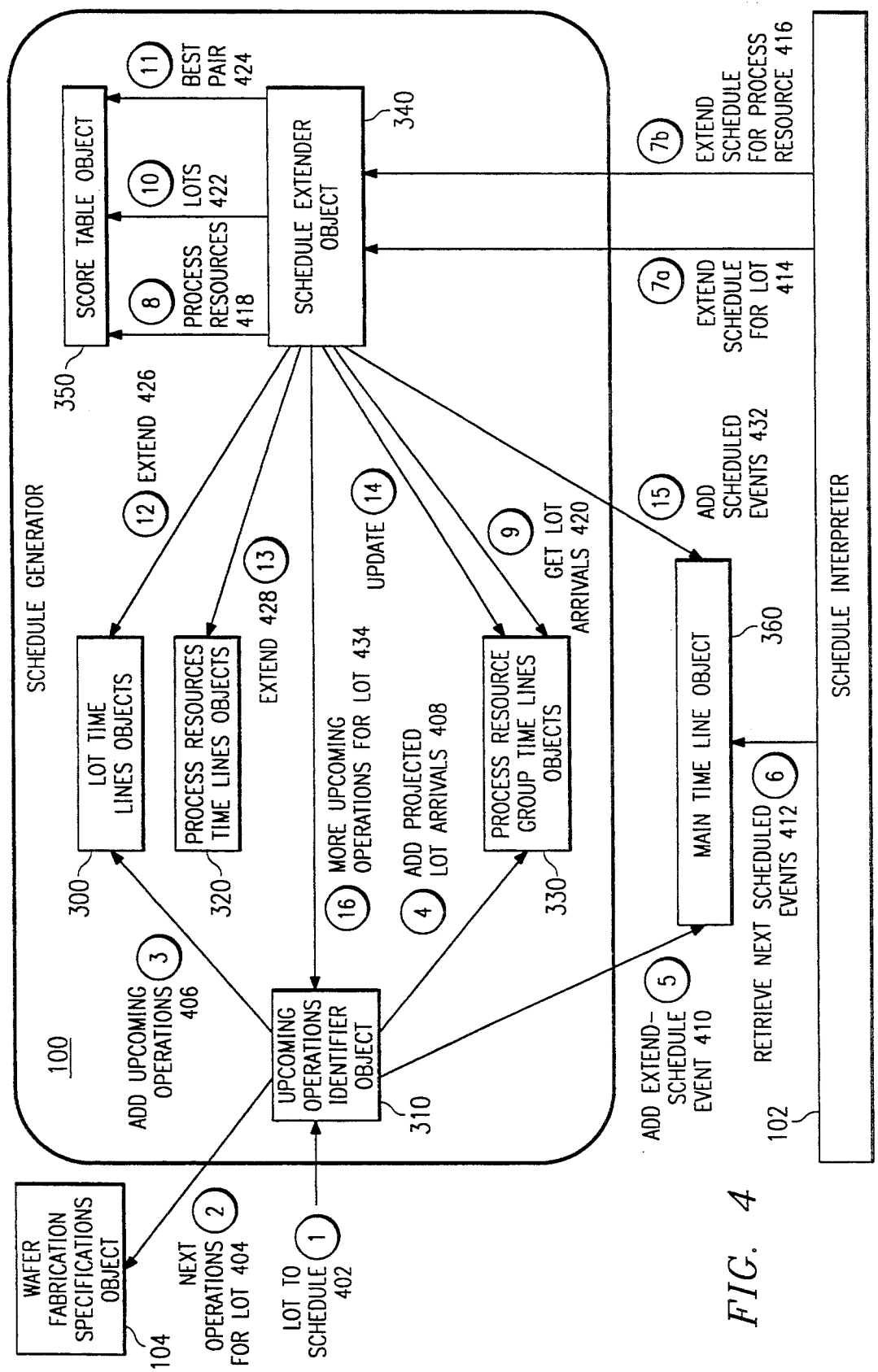
FIG. 4 illustrates scheduling and specification objects of the present invention.
Figure 7:
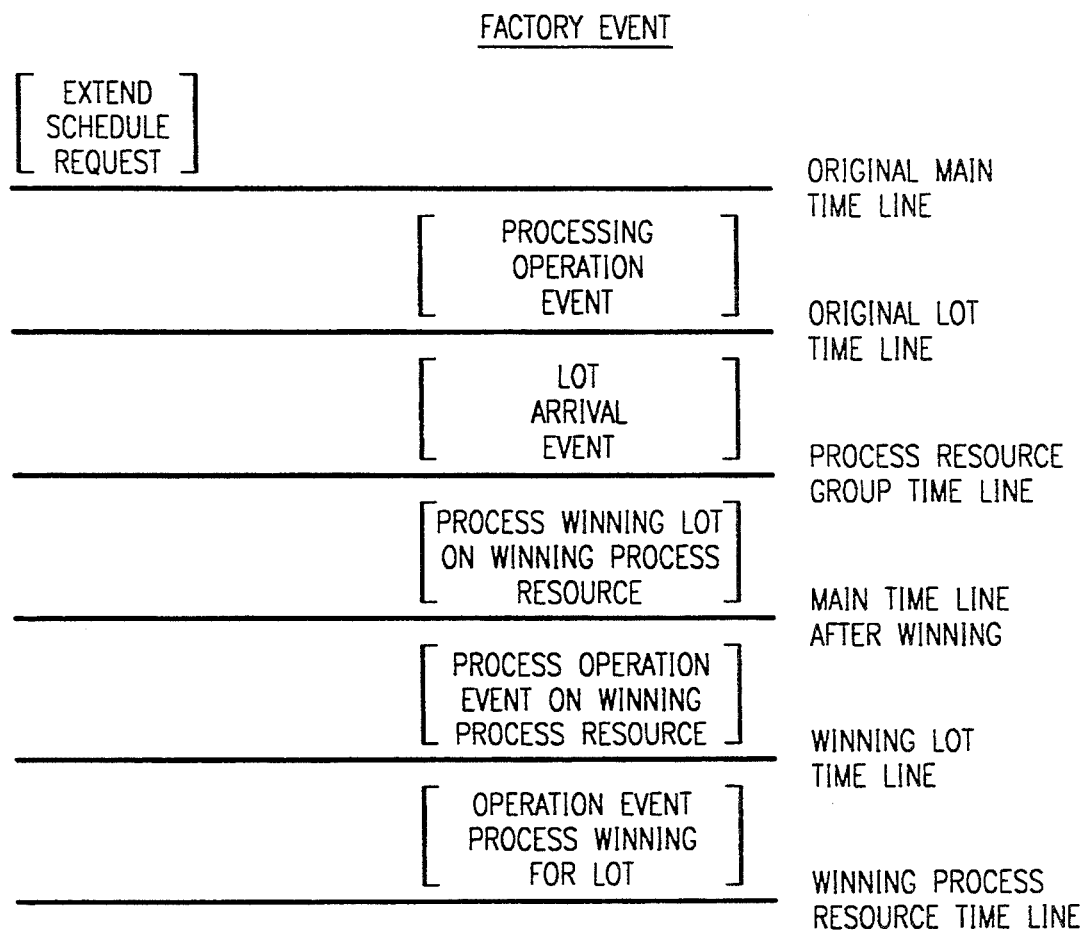
FIG. 7 illustrates a main time line, a lot time line and a process resource time line of the present invention.

FIG. 4 illustrates a sequence of messages sent between various objects of the schedule generator 100. For example, the schedule generator module 100 receives a message from the list of orders to be completed 220. The lot to schedule messages 402 sent from the list of orders 220 to the upcoming operations identifier object 310 informs the schedule generator 100 that a new lot may be scheduled for the factory 201. The upcoming operations identifier object 310 sends the next operation for lot message 404 to the wafer fabrication specification module 104 to determine the processing operations for this lot. The processing operations are performed by the process resources 200 or the tools of the factory 201. The upcoming operations identifier object 310 sends an add upcoming operations message 406 to lot time lines object 300 to add a processing operation event corresponding to processing operation of this lot to the time line of this lot. The lot time line is illustrated in FIG. 7.

The upcoming operations identifier object 310 sends an add projected lot arrivals message 408 to the process resource group time lines object 330. This message adds a lot arrival event for this lot to the time line for the object representing the group of process resources any of whom can perform this operation. The lot is placed on the time line at its estimated arrival time at the respective process resource group, for example, the estimated arrival time is the current time for the first operation, for the second operation, the arrival time is the estimated time to perform the first operation. For the third operation, the arrival event is the sum of the times to perform the first and second operations.

Subsequently, the upcoming operations identifier object 310 sends an add extend schedule event message 410 to the main line time object 360 to extend the schedule for this lot. This request to extend the schedule is added to the main time line as illustrated in FIG. 7. Periodically, the schedule interpreter module 102 sends a retrieve next scheduled event message 412 to the main time line object 360. If the earliest request from the main time line object 360 is to either move a lot from a process resource 200 of the factory or to commit a lot to a process resource 200 of the factory, the schedule interpreter object 102 sends messages that causes the factory to physically move lots or remove lots from a process resource 200 in the factory. When the schedule interpreter object 102 finds a request to extend a schedule on the main time line, the schedule interpreter module 102 sends an extend schedule for lot message 414 to the schedule extender object 340 to perform additional scheduling when the event is to schedule a lot, or the schedule interpreter module 102 sends a message 416 to the schedule extender object 340 to extend the schedule for the process resource when the event on the main time line is for a process resource. The schedule extender object 340 creates a score table 350 to facilitate scheduling choices. When the extend schedule for lot message 414 is received by the schedule extender object 340, the schedule extender object 340 determines the next processing operation to be scheduled, finds the corresponding process resource group and uses the process resource group to look up all the process resources in the dictionary of cross reference process resources that can perform the required operations and places these process resources in the score table as potentially able to process the lot using the process resources message 418. In addition, there may be more than one group of process resources placed in the score table 350 if some of the process resources have overlapping membership in different process resource groups.

The schedule extender, object 340 receives the extend schedule for process resource message 416 and determines a process resource group in accordance with the dictionary look-up as described above.

Presuming the extend schedule for lot message 414 is received by the schedule extender object 340, the lots for the score table must be determined by examining the time line of the process resource group that may perform the operation needed by the lot mentioned in the extend schedule message. The schedule extender object 340 sends a get lot arrivals message 420 to the process resource group time lines 330 to determine all lots that have an arrival event within a predetermined interval of time. This predetermined interval of time includes the lot from the extend schedule message as well as other lots that will need the same operation around the same time. These lots within the predetermined interval of time are included in the score table using the lots message 422. Next the schedule extender object 340 sends to the score table object 350 the best pair message 424 to evaluate all lot and process resource combinations. The score table object 350 determines the combination of a lot and a process resource that has the best score; this is the winning pair. The schedule extender object 340 sends an extend message 426 to lot time lines object 300 to add the process operation event on the process resource to the winning lot's time line. Additionally, the schedule extender lot 340 sends an extend message 428 to the process resource time lines object 320 to add the processing operation event for the lot to the winning process resource time line. Note that the winning lot and process resource is not necessarily the same lot which was originally requested to be scheduled. The schedule extender object 340 sends an update message 430 to the process resource group time lines object 330 to remove the lot arrival event corresponding to the winning lot from the time line of the process resource groups so this winning lot is not scheduled again. The schedule extender object 340 sends an add schedule events message 432 to the main time line object 360 to add the factory events to process the winning lot on the winning process resource. For example, the factory is controlled to move the winning lot to the winning process resource and commit the winning process resource to the winning lot. The main time line object 360 ensures that the schedule interpreter 102 schedules these events within the factory at the now defined time. Additionally, the main time line object 360 adds extend schedule events both for the winning lot and the winning process resource so that the winning lot is further process and the winning process resource is further scheduled for future lots. The schedule extender object 340 sends a more upcoming operations for lot message to upcoming operations identifier object 310 to indicate that one operation has been scheduled for the winning lot and the upcoming operations identifies object 310 should obtain the next unscheduled operation for the winning lot.

Figure 5:
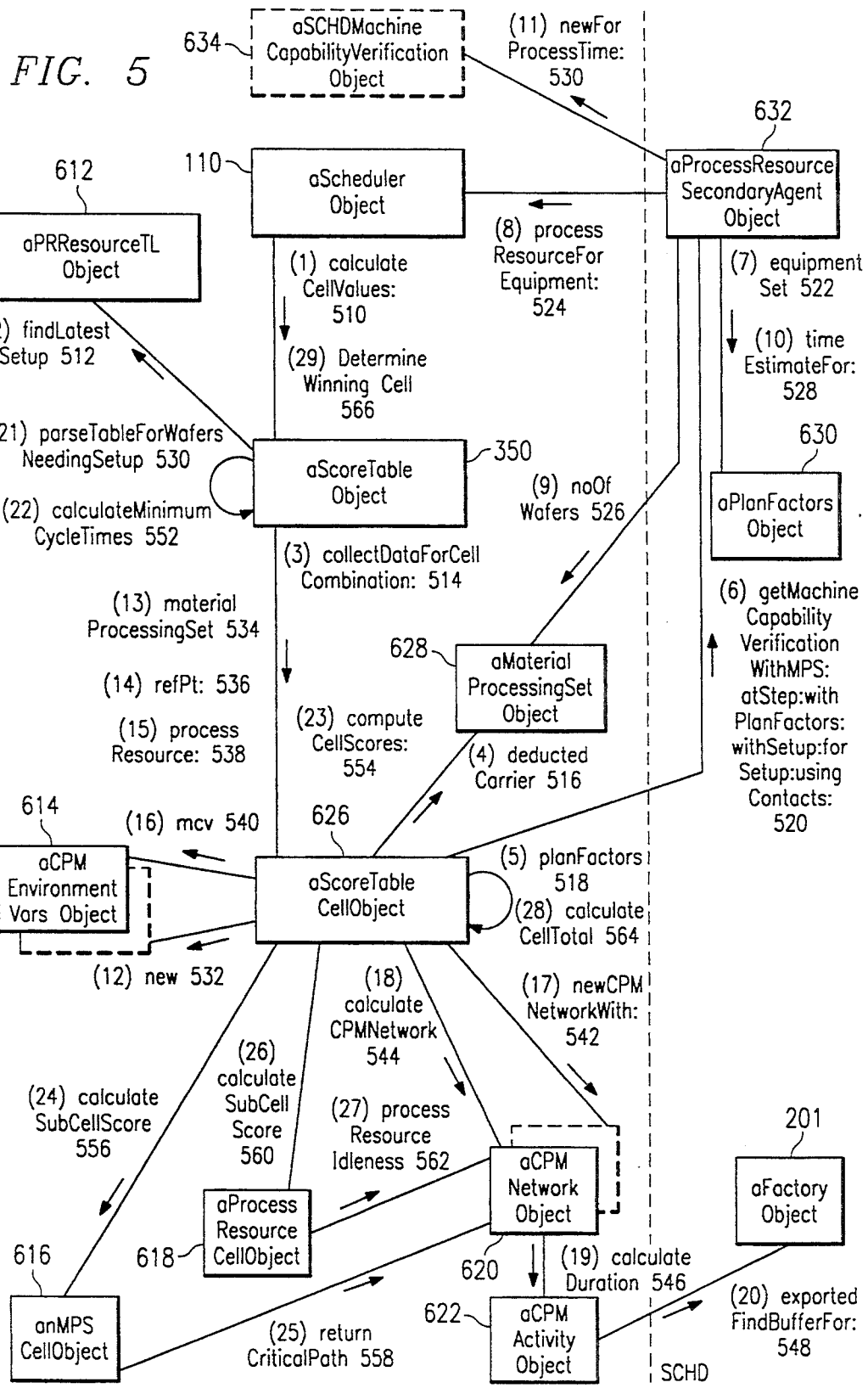
FIG. 5 illustrates additional objects of the scheduler, planner and factory modules.

In order to perform the score table computations, FIG. 5 illustrates the message sequence in order to fill these score tables with data so that the winning process resource and winning lot can be determined. When the scheduler object 110, for example, through the schedule extender object 340 sends a calculate cell value message 510 to the score table object 350, to calculate cell values, the score table object 350 calculates a score for each cell represented by a lot and a process resource found in the score table. The process resources placed in the score table corresponds to process resources that are alternatives for performing a particular manufacturing step. The score table object 350 sends a find latest setup message 512 to the PR resource time line object 612 to determine the process resource configuration or setup by checking the process resource time line prior to the operation being scheduled. The score table object 350 sends a collect data for cell combination message 514 to score table cell object 626 in order to initiate the collection of the data required to compute a score for a cell in the score table. The score table cell object 626 sends a deduced carrier message 516 to the material processing set object 628 to convert the lot name from a scheduler internal name to a lot name that the process resource will recognize. The score table cell object 626 sends a plan factor message 518 to itself, the score table cell object 626, to determine the plan factors that provide a description of the processing resources that may perform this step along with estimates of the processing time. Since the specification module 104 provides only values reflecting the current design criteria for the processing resource, additional data may be necessary since the processing resource may now not be able to conform to the plan factors found in the specification as a result of a recent modification of the process resource for example on the floor of the factory. In order to obtain more complete information, the score table cell object 626 sends a get machine capability verification with MPS with planned factors setup using contact message 520 to process resource secondary agent object 632 to determine the time required for the process resource to process a lot, the time period required to convert from the current setup to the setup required for the lot, the setup required to process the lot, and the time period required for the process resource to switch back from the proposed setup to the current setup.

If the process resource 632 has no more current information than is available from the plan factors in the wafer specification module 104, this information is obtained from messages 522, 524, 526 and 528. The process resource secondary agent object 632 sends an equipment set message 522 to the plan factor object 630 to determine the processing resources that can perform this step. For example, if an etch step is required, the planned factors object 630 identifies all the process equipment which may perform the etching. The process resource secondary agent object 632 sends a process resource for equipment message 524 to the scheduler object 110 to convert the name used for process resources in the wafer specification into the names recognized by the factory floor control systems. The process resource secondary object 632 sends a number of wafer message 526 to the material processing set object 628 to determine how many actual wafers are in this lot, for example, a lot may consist of ten wafers. The process resource secondary object 632 sends a time estimate for message 528 to plan factors object 630 to provide estimates for processing a particular lot on a particular resource. For example, a lot of ten wafers may require that an etcher would require ten minutes to etch the ten wafers. Finally, the process resource secondary object 632 sends a new for process time message 530 to a new schd machine capability verification object 634 in order to hold the results obtained, for example, the names, the number of wafers, the estimate to process on a particular process resource. Thus, whether or not the planned factors were determined from the wafer specification or not, the following steps are executed.

The score table cell object 626 sends a new message 532 to the CPM environment vars object 614 to store all of the data required to create a critical path method activity network to describe all of the activities required to process the lot on the process resource. (see FIG. 6) The score table cell object 626 sends a material processing set message 534 to the CPM environment vars object 614 to specify the lot whose processing will be described by the CPM network. The score table cell object 626 sends a reference point message 536 to the CPM environment vars object 614 to establish a common reference point so that all activity durations within the critical path network are measured from this reference point and to establish a common reference point for all the cells within the score table. The reference point may be the earliest time that a newly scheduled event could be added to the various time lines for any of the lots and process resources to ensure that the duration of these events are all positive numbers.

Figure 6:
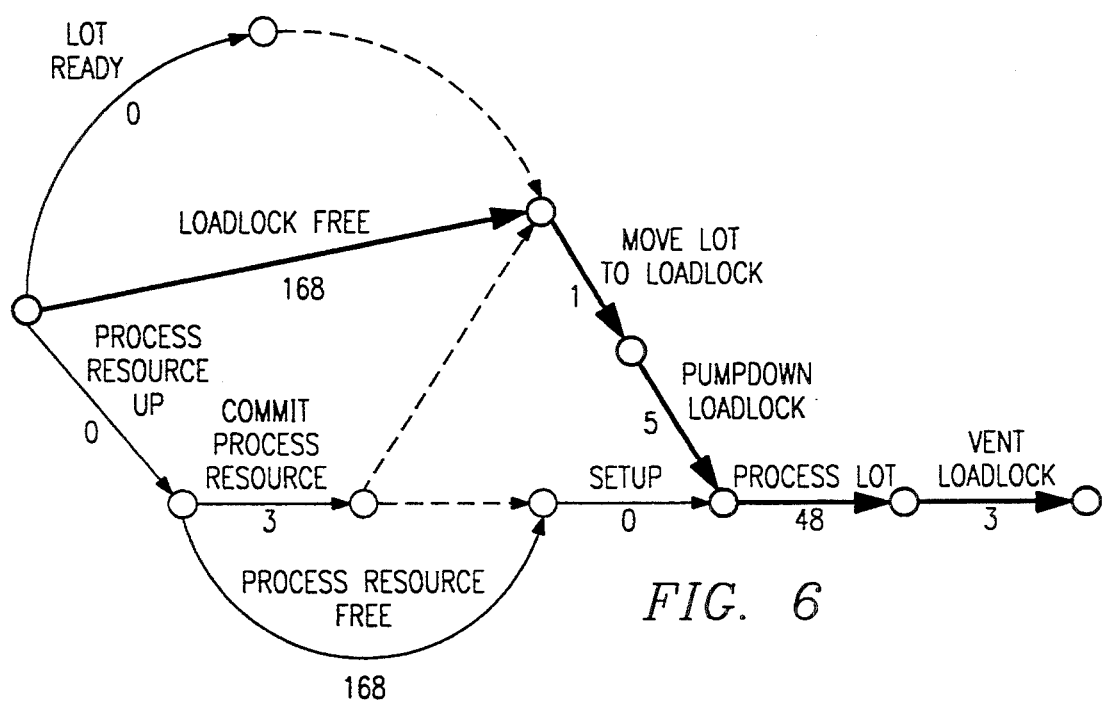
FIG. 6 illustrates a critical path for a lot using the present invention.

The score table cell object 626 sends a process resource message 538 to the CPM environment vats object 614 to specify the process resource as a variable for the critical path method environment. The score table cell object 626 sends a machine capability verification message 540 to the CPM environment vars object 614 to include the schd machine capability verification object 634 created in previous steps. The score table cell object 626 sends a new CPM network with message 542 to the critical path method network object 620 to construct all of the detailed activities of the critical path method network. For example, FIG. 6 shows an example critical path network with activities of move lot, pump down vacuum load lock of the machine, process lot and provide a cooling period for the wafers. The resulting critical path being shown in solid bold lines. The score table cell object 626 sends a calculate critical path method network message 544 to the critical path network object 620 to calculate the duration of each activity in the network; the numbers below the arcs in FIG. 6 show example durations for the activities. The critical path method network object 620 sends a calculate duration message 546 to each critical path method activity object 622 to calculate the time period of each activity within the critical path network by reading the data of the current schedules for the lot and process resource and consulting the CPM environment vars object 614. The critical path method activity object 622, sends an exported find buffer for message 548 to the factory object 201 to determine which storage buffer corresponds to the particular process resource. This is required if one of the lots on the floor of the factory should be moved to a storage buffer in order to wait between processing on processing resources. The score table object 350 sends a parse table for wafers needing setup message 550 to itself, the score table object 350; the score table cells are searched to find all wafers that may use the same setup. The number of wafers found is used to transform cell values into cell scores (see FIG. 9). Furthermore, the score table object 350 sends a calculate minimum cycle time message 552 to itself, a score, table object 350, so that each cell in the score table can determine through the critical path network and corresponding critical path how long it will take the lot to complete processing on the process resource. The cells corresponding to a predetermined lot are compared with each other to find the minimum time need to process the lot on any process resource and this minimum is used to compute a cell score in message 556. The score table object 350 sends a compute cell score message 554 to score table cell object 626 to compute the scores for the score table by issuing messages 556, 558, 560 and 562. The score table cell object 626 sends a calculate subcell score message 556 to MPS cell object 616 to calculate the lot score for a predetermined cell by computing scores for each lot factor and combining the lot factor scores. Lot factors can be simply added together or combined through the use of weights in order to add relative importance to particular factors. The MPS cell object 616 sends a return critical path message 558 to the critical path network object 620 to obtain the critical path length from the critical path network for each cell in order to compute the critical path length score for each cell. The critical path length score for normal priority lots is calculated in accordance with minus the critical path length divided by the minimum critical path length plus one. (see FIG. 13) The score table cell object 626 sends a calculate subcell score message 560 to the process resource cell object 618 to calculate the tool score for each cell by computing the scores for each tool factor and combining these scores. The tool score can be calculated by adding the tool factors or different weights can be applied to the tool factors in order to emphasize or de-emphasize a particular tool factor. The process resource cell object 618 sends a process resource idleness message 562 to the critical path network object 620 to examine the critical path network and to calculate the free slack for activities involving the process resource which determines the time that the process resource will be idle if a given lot is processed on this process resource. The score table cell object 626 sends a calculate cell total message 564 to itself, the score table cell object 626, to calculate each cell total by combining the subcell totals together. The combination can be achieved by adding the subcell subtotals or by weighing each of the subcells of the lot and tool scores and then adding. The scheduler object 110 then determines a winning cell by sending a determine winning cell message 566 to the score table objects 350 to determine the cell with the highest score. An entry to process this lot on this process resource is then added to the time line for the respective process resource and lot.

FIGS. 8-14 illustrate translation from score table cell values to score table cell scores for a variety of lot, and tool factors. Although various types of lot and tool factors are illustrated it is to be understood that the present invention did not employ all of the illustrated lot and tool scores in order to come up with a total tool score, any combination or all of the lot and tool factors may be used to determine the scores in a given score table 350.

Figure 8:
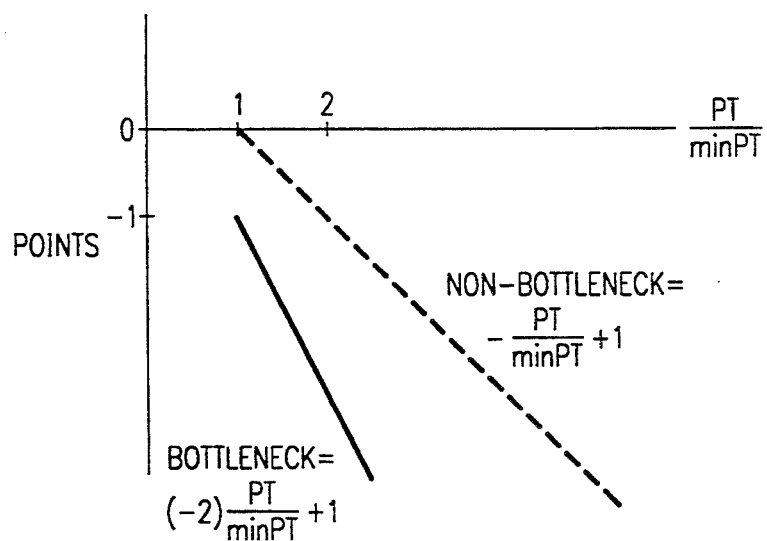
FIG. 8 illustrates the relationship between the machine process time and the points corresponding to scores.

FIG. 8 illustrates the relationship between the machine process time/lot and the tool scores which are characterized for both non-bottleneck and bottleneck machines. The score points are related to the ratio of the process time for the particular machine in question to the minimum process time for that lot on any machine. Although for purposes of illustration, a linear relationship between points and machine process time/lot has been illustrated, any relationship could be adapted for use with the present invention, for example, quadratic.

Figure 9:
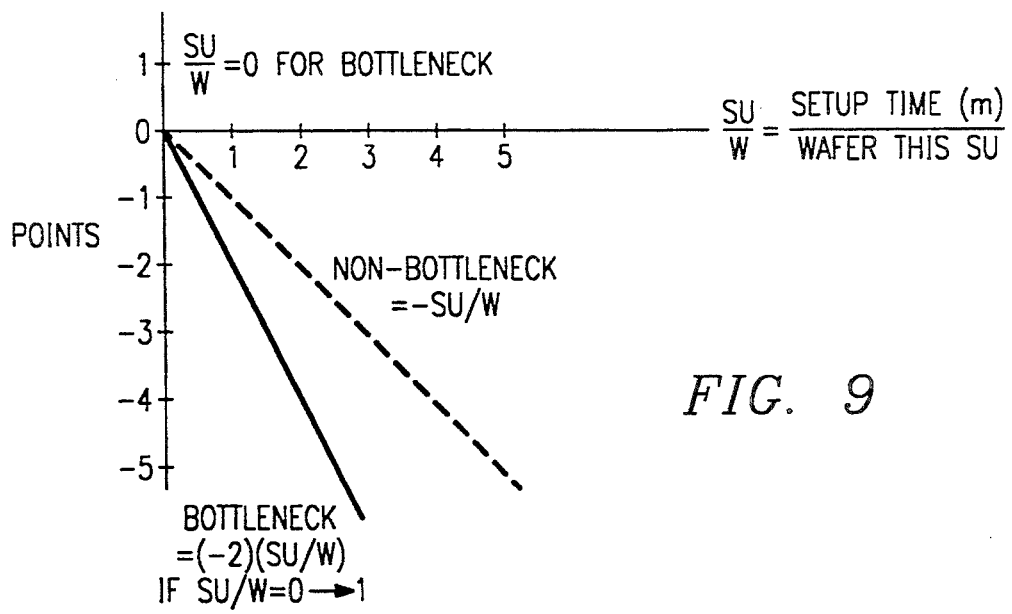
FIG. 9 illustrates the relationship between the machine set-up per wafer and points corresponding to scores.

FIG. 9 illustrates the relationship between the machine setup time and the points corresponding to the score. The setup time for this process resource is divided by the numbers of wafers in lots in the score table that also need this same setup.

Figure 10:
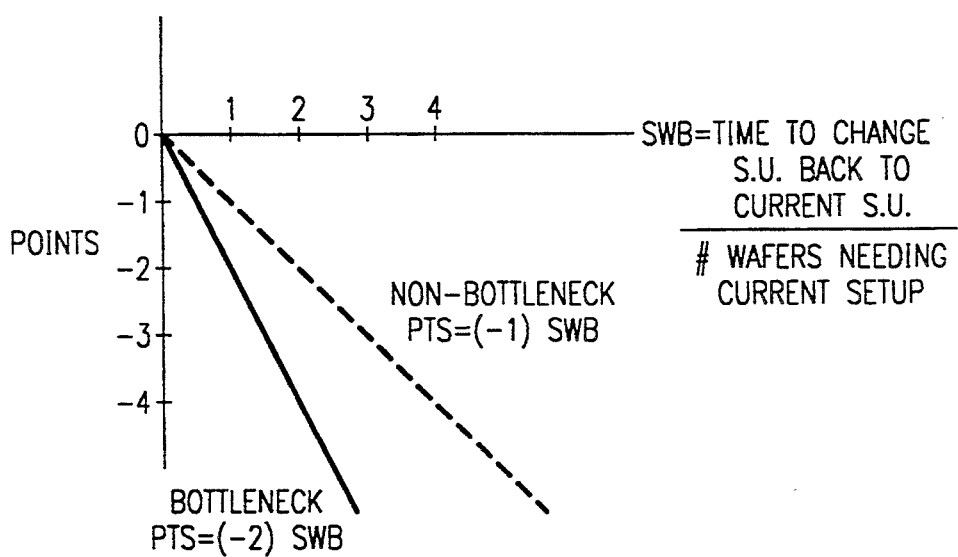
FIG. 10 illustrates the relationship between the machine setup switch back time and points corresponding to scores.

FIG. 10 illustrates the relationship between the points corresponding to the score and the machine setup switchback time. The switchback time is the time to change the setup back to the current setup. The switchback time equals the time to change back to the current setup from a proposed setup divided by the wafers needing the current setup.

Figure 11:
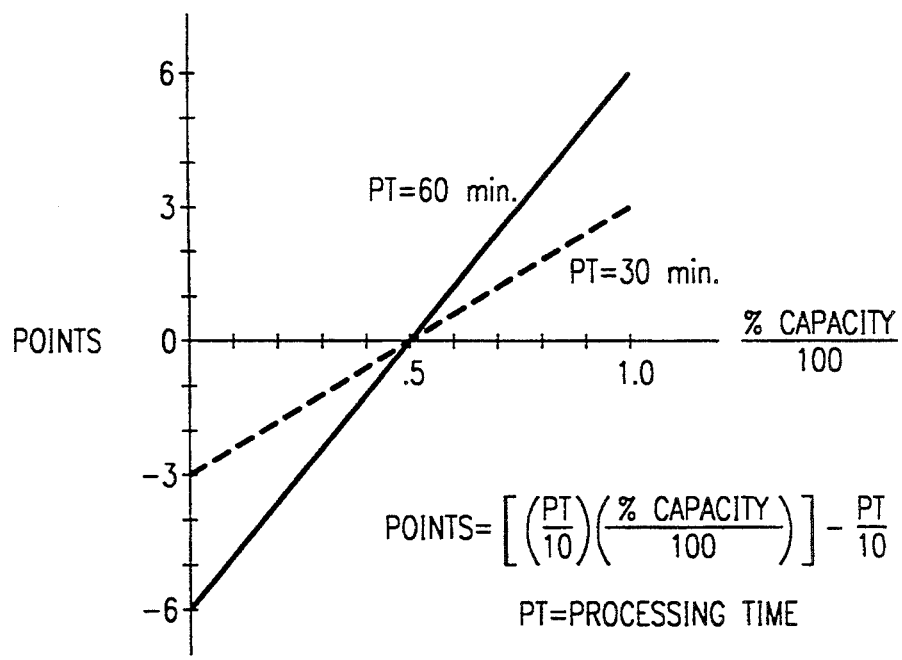
FIG. 11 illustrates the relationship between the batch machine percent of capacity and the points corresponding to scores.

FIG. 11 illustrates the relationship between the points corresponding to the score and the batch machine percent capacity. The points are calculated by 2 times the processing time divided by 10 times the percent of capacity of the process resource divided by 100 minus the processing time divided by 10.

Figure 12:
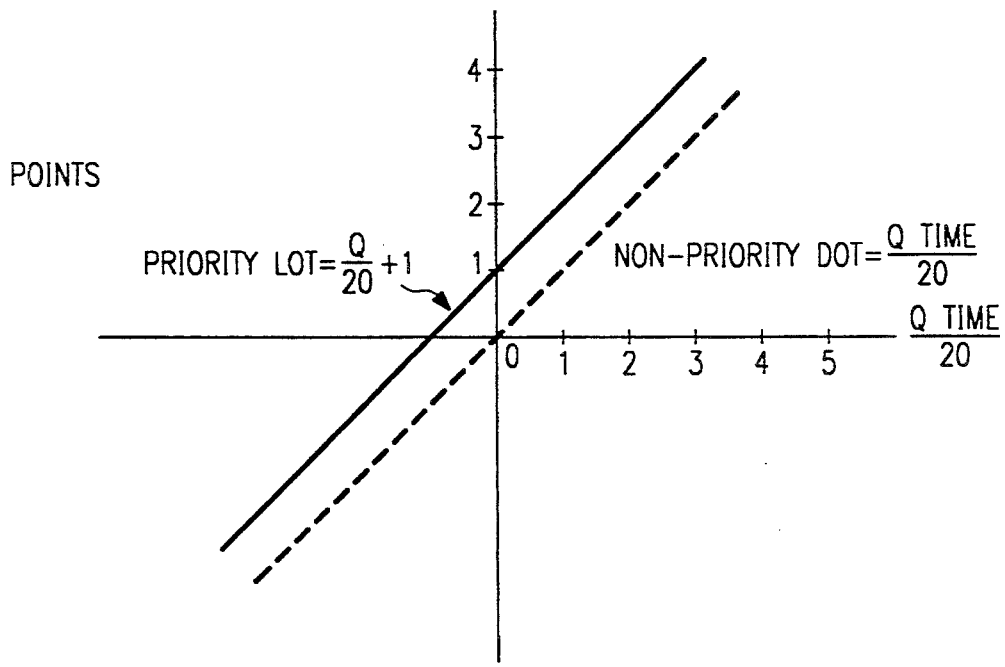
FIG. 12 illustrates the relationship between the carrier queue time and the points corresponding to scores.

FIG. 12 illustrates the relationship between the points and the lot queue time for both a high priority lot and a normal priority lot.

Figure 13:
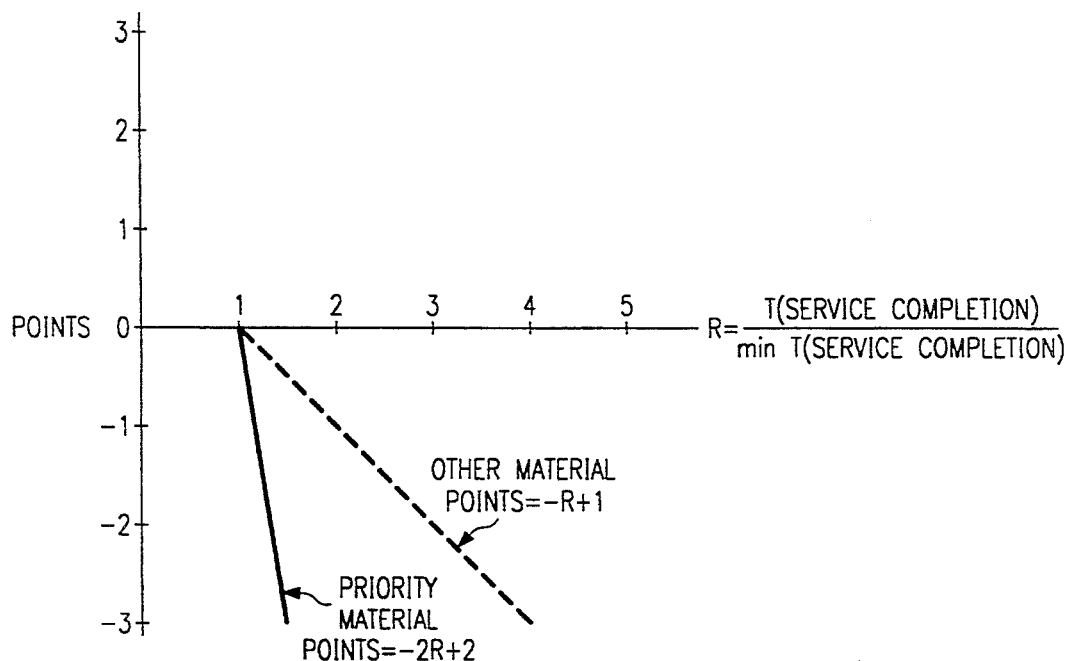
FIG. 13 illustrates the relationship between the carrier completion times and the corresponding points.

FIG. 13 illustrates the relationship between the points and a ratio of carrier completion times. The ratio compares critical path lengths by dividing the time to complete this operation on this lot on the process resource being considered by the minimum time to complete this operation on this lot on any process resource.

$$R = \frac{T(\text{SERVICE COMPLETION})}{\text{MIN } T(\text{SERVICE COMPLETION})}$$

Figure 14:
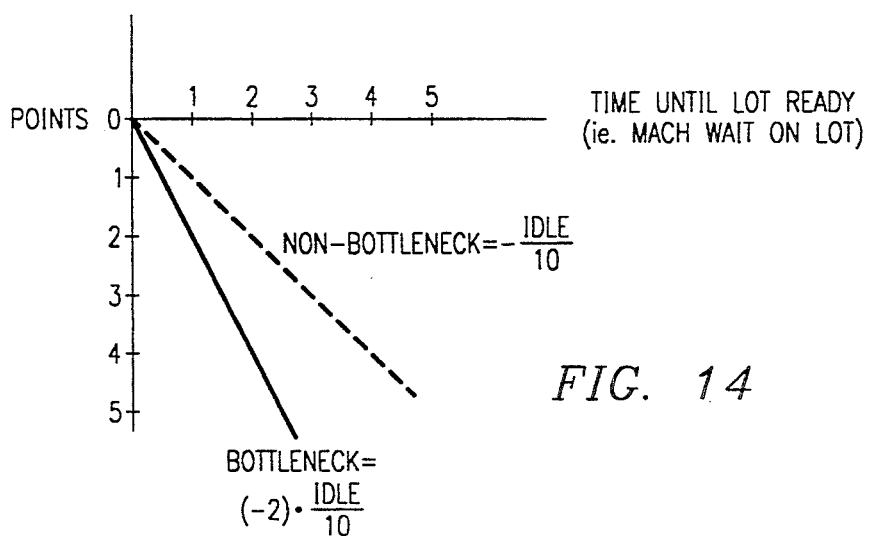
FIG. 14 illustrates the relationship between the machine idle time and the points corresponding to points.

FIG. 14 illustrates the relationship between the points and the machine idle time where the machine idle time is the time the machine must sit idle until the lot arrives at the machine for processing.

| (a) L3 on PR1 | | |
|---|---|---|
| LOT FACTORS | VALUE | SCORE |
| Critical Path Length | 225 min | −0.2 |
| Queue Time | 0 min | 0.0 |
| Lot Score | | −0.2 |
| TOOL FACTORS | VALUE | SCORE |
| Resource Idle | 6.0 min | −0.6 |
| Setup/Wafer | 0 min/w | 0.0 |
| Tool Score | | −0.6 |
| TOTAL | | −0.8 |

Example 1 illustrates the lot factors for example the critical path length and the queue time and tool factors for example resource idle, setup/wafer for the lot L3 on process resource PR1. FIG. 6 shows the critical path method network for Example 1 and the critical path length and resource idle values are obtained from this network. The relationship in FIGS. 8-14 are used to determine scores from the values for each factor. The sum of the scores from the lot factors determine a lot score, and the sum of the scores from the tool factors determine a tool score. The lot score and the tool score are combined to provide a total score for lot L3 on process resource PR1.

| (a) L3 on PR2 | | |
|---|---|---|
| LOT FACTORS | VALUE | SCORE |
| Critical Path Length | 193 min | 0.0 |
| Queue Time | 0 min | 0.0 |
| Subtotal | | 0.0 |
| TOOL FACTORS | VALUE | SCORE |
| Resource Idle | 6.0 min | −0.6 |
| Setup/Wafer | 0 min/w | 0.0 |
| Subtotal | | −0.6 |
| TOTAL | | −0.6 |

In comparison, Example 2 illustrates the determination of these scores from lot factors and tool factors obtained from the graphs for L3 on process resource PR2. A subtotal is obtained for both the lot factors and the tool factors and in turn a total is obtained from the subtotal of the lot factors and the subtotal of the tool factor. This total is compared with the total from L3 on PR1 and it can be clearly seen that the combination of lot 3 on process resource PR2 provides an additional benefit. This benefit is clearly illustrated by the fact that the score contribution from the critical path length is greater (more positive) when the lot L3 is processed on resource PR2 instead of process resource PR1.

TABLE II
INITIAL SCORE TABLE

|    | LOT | TOOL | LOT SCORE | TOOL SCORE | TOTAL |
|----|-----|------|-----------|------------|-------|
| 1. | L1  | PR1  | 0.0       | −0.6       | −0.6  |
| 2. | L1  | PR2  | −0.6      | −0.6       | −1.2  |
| 3. | L2  | PR1  | −0.5      | −0.6       | −1.1  |
| 4. | L2  | PR2  | −1.1      | −0.6       | −1.7  |
| 5. | L3  | PR1  | −1.0      | −0.6       | −1.6  |
| 6. | L3  | PR2  | −1.6      | −0.6       | −2.2  |

Example 3 illustrates the comparison of a combination of lots L1–L3 with process resource PR1 and PR2. The highest score is achieved with lot L1 on process PR1 resulting in a higher (lowest negative) score. Thus very clearly when lots L1, L2 and L3 are in contention for process resource PR1 and PR2, the most advantageous combination with lot L1 with process resource PR1.

TABLE III
SCORE TABLE AFTER ONE LOT SCHEDULED

|    | LOT | TOOL | LOT SCORE | TOOL SCORE | TOTAL |
|----|-----|------|-----------|------------|-------|
| 1. | L2  | PR1  | 0.0       | −0.6       | −0.6  |
| 2. | L2  | PR2  | −0.1      | −0.6       | −0.7  |
| 3. | L3  | PR1  | −0.5      | −0.6       | −1.1  |
| 4. | L3  | PR2  | −0.6      | −0.6       | −1.2  |

Example 4 illustrates the score table developed next where the lots L2 and L3 are evaluated with process resources PR1 and PR2. It can be seen that lot L2 on process resource PR2 provides the highest score, for example the lowest negative score.

TABLE IV
SCORE TABLE AFTER TWO LOTS SCHEDULED

|    | LOT | TOOL | LOT SCORE | TOOL SCORE | TOTAL |
|----|-----|------|-----------|------------|-------|
| 1. | L3  | PR1  | −0.2      | −0.6       | −0.8  |
| 2. | L3  | PR2  | 0.0       | −0.6       | −0.6  |

Further as illustrated in example 5, the same process is used to determine whether lot L3 should be processed on process resource PR1 or process resource PR2. Example 5 illustrates that lot L3 on process resource PR2 achieves the higher (less negative) score than lot L3 on process resource PR1. Example 1 shows the details of the computation for lot L3 on process resource PR1 and Example 2 shows the details for lot L3 on process resource PR2.

| M1: IDLE 48 WAFER CAPACITY | | | | |
|---|---|---|---|---|
| C1: 24 WAFERS Recipe A PT: 60 min Q: 50 min | C2: 24 WAFERS Recipe A PT: 60 min Q: −10 min | C4: 24 WAFERS Recipe B PT: 48 min Q: −60 min | C5: 24 WAFERS Recipe B PT: 48 min Q: 60 min | |

Example 6 illustrates the processing of four lots of wafers C1 and C2 requiring a first recipe and C4 and C5 requiring a second recipe. C1 is ready to be processed and has been waiting to be processed while C2 is not ready and is 10 minutes away from this operation. C4 is 60 minutes away from this operation and C5 is ready and has been waiting. This example shows the effects of batches that are ready and not ready to be processed as well as batches having different number of wafers to be processed, different recipes of processing required, different processing times and different queue times. Furthermore, for the sake of illustration, the machine is idle and has a 48 wafer capacity.

| | TOOL SCORE | | BATCHING LOT SCORE | | | TOTAL SCORE |
|---|---|---|---|---|---|---|
| C1: 24 W. Rec. A | M-IDLE PT = 60 −(60/60) + 1 S.U. | = = = | 0 0 0 0 | W-M W-SU PT −(60/60) + 1 Q = 50/20 | 0 0 60 60 = 0 = 2.5 | 0 +2.5 2.5 2.5 |
| C2: 24 W. Rec. A | M-IDLE $\underline{-10}$ 10 PT = 60 −(60/60) + 1 S.U. | = = = | −1 0 0 −1.0 | W-M W-SU PT −(60/60) + 1 Q = −10/20 | 0 0 60 60 = 0 = $\underline{-.5}$ | −1.0 −.5 −1.5 −.5 |
| C4: 24 W. Rec. B | M-IDLE $\underline{-60}$ 10 PT = 48 −(48/48) + 1 S.U. | = = = | −6 0 0 −6 | W-M W-SU PT −(48/48) + 1 Q = −60/20 | 0 0 48 48 = 0 = $\underline{-3}$ | −6 −3 −9 −3 |
| C5: 24 W. SU. B | M-IDLE PT = 48 −(48/48) + 1 | = | 0 0 | W-M W-SU PT | 0 0 48 | 0 +3 3 |

|  | TOOL SCORE |  | BATCHING LOT SCORE |  |  | TOTAL SCORE |
|---|---|---|---|---|---|---|
| REC | = | 0 | 48 |  |  |  |
|  |  | 0 | −(48/48) + 1 | = | 0 |  |
|  |  |  | Q = 60/20 | = | 3 |  |
|  |  |  |  |  | 3 |  |

Example 7 illustrates the comparison of the four wafer lots by the tool score, the lot score and the total score. The tool score includes the machine idle score the machine process time and machine setup time score. The lot score includes the critical path length score and the queue time score. As with the previous examples, the subtotal is obtained by summing the tool score and lot score for each lot-tool pair and the winning score is lot C5, in that C5 obtained a total score of +3 which was greater than the total score C1 2.5, C2 −1.5 and C4 −9.0.

the tool score in terms of sub-tool scores and the lot score in terms of sub-lot scores and summing these up and picking the winner, the present invention is able to provide more efficient scheduling and controlling lots within a factory.

The last group of examples illustrate the advantageous nature of the present invention in that the present invention is compared with a first in, first out (FIFO system).

|  | TOOL SCORE |  |  | 1ST LOT IN BATCH |  |  | 2ND LOT IN BATCH |  |  | TOTAL |
|---|---|---|---|---|---|---|---|---|---|---|
| C5 & C4: | M-IDLE: |  |  | W-M: | 0 |  | W-M: | 0 |  | −1.2 |
|  | −60/10 | = | −6.0 | W-C: | 60 |  | W-C: | 60 |  | 1.75 |
|  | PT: 48M |  |  | PT: | 48 |  | PT: | 48 |  | −3.0 |
|  | −(48/48) + 1 | = | 0.0 |  | 108 |  |  | 108 |  | −2.45 |
|  | % CAP: 100% | = | 4.8 | −(108/48) + 1 | = | −1.25 | −(108/108) + 1 | = | 0 |  |
|  |  |  | −1.2 | Q: |  |  | Q: |  |  |  |
|  |  |  |  | 60/20 | = | 3.0 | −60/20 | = | −3.0 |  |
|  |  |  |  |  |  | 1.75 |  |  | −3.0 |  |
| C5: | M-IDLE: 0 |  |  | W-M: | 0 |  |  |  |  | 0 |
|  | PT: 48 |  |  | W-C: | 0 |  |  |  |  | +3.0 |
|  | −(48/48) + 1 | = | 0 | PT: | 48 |  |  |  |  | 3.0 |
|  | % CAP: 50% | = | 0 | −(48/48) + 1 | = | 0 |  |  |  |  |
|  |  |  | 0 | Q: |  |  |  |  |  |  |
|  |  |  |  | 60/20 | = | 3.0 |  |  |  |  |
|  |  |  |  |  |  | 3.0 |  |  |  |  |
| C1 & C2: | M-IDLE: |  |  | W-M: | 0 |  | W-M: | 0 |  | 5.0 |
|  | −10/10 | = | −1 | W-C: | 10 |  | W-C: | 10 |  | 2.33 |
|  | PT: 60 |  |  | PT: | 60 | = | 70 PT: | 60 |  | −0.5 |
|  | −(60/60) + 1 | = | 0 | −(70/60) + 1 | = | −.17 | −(70/70) + 1 | = | 0 | 6.83 |
|  | % CAP: 100% | = | 6.0 | Q: |  |  | Q: |  |  |  |
|  |  |  | 5.0 | 50/20 | = | 2.5 | −10/20 | = | −0.5 |  |
|  |  |  |  |  |  | 2.33 |  |  | −0.5 |  |
| C1: | M-IDLE: 0 |  |  | W-M: | 0 |  |  |  |  | 0 |
|  | PT: 60 |  |  | W-C: | 0 |  |  |  |  | 2.5 |
|  | −(60/60) + 1 | = | 0 | PT: | 60 |  |  |  |  | 2.5 |
|  | % CAP: 50% | = | 0 | −(60/60) + 1 | = | 0 |  |  |  |  |
|  |  |  | 0 | Q: |  |  |  |  |  |  |
|  |  |  |  | 50/20 | = | 2.5 |  |  |  |  |
|  |  |  |  |  |  | 2.5 |  |  |  |  |

Example 8 illustrates a comparison of the highest rated lot, (shown in Example 7) namely C5, by itself, the highest rated lot with the next highest rated lot, namely C4 of the same recipe. Similarly, the second highest rated lot C1, is compared by itself as with the next highest rated lot of the same recipe, C2. The comparison illustrates that the best combination is lot C1 and C2; note that this combination receives a higher tool score than C5 and C4 since the score from machine idle time is significantly higher for the combination of C5 and C4 with respect to C1 and C2. Thus, by evaluating C6: 24 WAFER
Needs Setup A
Q = 60
M2: Idle IN 6 MIN.
Setup A currently
1 min/wafer C7: 24 WAFER
Needs Setup A
Q = 20

C8: 24 WAFER
Needs Setup B
Q = 30
M3: IDLE STATUS
Setup B currently
2 min/wafer

Example 9 illustrates the wafer lots C6, C7 and C8 and the status of machines M2 and M3 either of which can process wafers in accordance with setup A and setup B. Changing the setup on a machine takes 12 minutes in this example.

|  |  | M3 TOOL SCORE |  | LOT SCORE |  | TOTAL SCORE | M2 TOOL SCORE |  | LOT SCORE |  | TOTAL SCORE |
|---|---|---|---|---|---|---|---|---|---|---|---|
| C6 | M-IDLE |  | 0 | W-M: | 0 | −1.75 | M-IDLE: | 0 | WM | 6 | 0 |
| 24 | PT: |  | 48 | W-SU: | 12 | +2.0 | PT: | 24 | WSU | 0 | +3 |

-continued

| | M3 TOOL SCORE | | LOT SCORE | | TOTAL SCORE | M2 TOOL SCORE | | LOT SCORE | | TOTAL SCORE |
|---|---|---|---|---|---|---|---|---|---|---|
| Wa- | −(48/24) + 1 = | −1 | PT: | 48 | 0.25 | −(24/24) + 1 = | 0 | PT | 24 | 3 |
| fers | SU/W = | −.25 | | 60 | | SU/W: | 0 | | 30 | |
| Set- | −12/48 = | | −60/30 + 1 = | −1 | | SWB: | 0 | −(30/30) + 1 = | 0 | |
| up A | SWB = | −.5 | Q = 60/20 = | 3 | | −1(0) = | 0 | Q = 60/20 = | 3 | |
| Q = | −12/24 = | | | 2 | | | 0 | | 3 | |
| 60 | | −1.75 | | | | | | | | |
| C7 | M-IDLE | 0 | W-M: | 0 | −1.75 | M-IDLE: | 0 | WM | 6 | 0.0 |
| 24 | PT: | 48 | W-SU: | 12 | +0.0 | PT: | 24 | WSU | 0 | +1.0 |
| Waf- | −(48/24) + 1 = | −1 | PT: | 48 | −1.75 | −(24/24) + 1 = | 0 | PT | 24 | 1.0 |
| ers | SU/W = | −.25 | | 60 | | SU/W: | 0 | | 30 | |
| Set- | −12/48 = | | −(60/30) + 1 = | −1 | | SWB: | 0 | −(30/30) + 1 = | 0 | |
| up A | SWB = | −.5 | Q = 20/20 = | 1 | | −1(0) = | 0 | Q = 20/20 = | 1 | |
| Q = | −12/24 = | | | 0 | | | 0 | | 1 | |
| 20 | | −1.75 | | | | | | | | |
| C8 | M-IDLE | 0 | W-M: | 0 | −1.0 | M-IDLE: | 0 | WM | 6 | −0.75 |
| 24 | PT: | 48 | W-SU: | 0 | +1.35 | PT: | 24 | WSU | 12 | +1.5 |
| Waf- | −(48/24) + 1 = | −1 | PT: | 48 | 0.35 | −(24/24) + 1 = | 0 | PT | 24 | 0.75 |
| ers | SU/W = | 0 | | 48 | | SU/W: | −.5 | | 42 | |
| Set- | 0/24 = | | −(48/42) + 1 = | −.15 | | −12/24 = | | −(42/42) + 1 = | 0 | |
| up B | SWB = | 0 | Q = 30/20 = | 1.5 | | SWB: | −.25 | Q = 30/20 = | 1.5 | |
| Q = | −(0) = | | | 1.35 | | −12/48 = | | | 1.5 | |
| 30 | | −1 | | | | | −0.75 | | | |

Example 10 illustrates the comparison between C6, C7 and C8 with respect to machine scores and lot scores resulting in a total score. The machine scores considers idle time, process time, setup time and switch back time while the lot scores include wait for idle time, wait for switch back time, process time, and queue time. As illustrated in Example 10, the winner is C6 on machine 2.

| | M3 TOOL SCORE | | LOT SCORE | | TOTAL SCORE | M2 TOOL SCORE | | LOT SCORE | | TOTAL SCORE |
|---|---|---|---|---|---|---|---|---|---|---|
| C8 | M-IDLE | 0 | W-M: | 0 | −1.0 | M-IDLE: | 0 | WM | 54 | −0.75 |
| 24 | PT: | 48 | W-SU: | 0 | +1.5 | PT: | 24 | WSU | 12 | +0.62 |
| Wa- | −(48/24) + 1 = | −1 | PT: | 48 | 0.5 | −(24/24) + 1 = | 0 | PT | 24 | −0.13 |
| fers | SU/W = | 0 | | 48 | | SU/W: | −.5 | | 90 | |
| Set- | 0/24 = | | −(48/48) + 1 = | 0 | | −12/24 = | | −(90/48) + 1 = | −.88 | |
| up B | SWB = | 0 | Q = 30/20 = | 1.5 | | SWB: | −.25 | Q = 30/20 = | 1.5 | |
| Q = | −(0) = | | | 1.5 | | −12/48 = | | | 0.62 | |
| 30 | | −1 | | | | | −0.75 | | | |

As illustrated in Example 11, the remaining two lots namely C7 and C8 are evaluated for machine 2 and machine 3. The result is that C3 wins by processing on M2.

As illustrated in Example 12, lot C8 is compared with respect to machine 1 and machine 2 and in this case machine 3 wins since the score is higher than this lot with machine 2.

FIFO:

| | M3 TOOL SCORE | | LOT SCORE | | TOTAL SCORE | M2 TOOL SCORE | | LOT SCORE | | TOTAL SCORE |
|---|---|---|---|---|---|---|---|---|---|---|
| C7 | M-IDLE | 0 | W-M: | 0 | −1.75 | M-IDLE: | 0 | WM | 30 | 0.0 |
| 24 | PT: | 48 | W-SU: | 12 | +0.9 | PT: | 24 | WSU | 0 | +1.0 |
| Wa- | −(48/24) + 1 = | −1 | PT: | 48 | −0.85 | −(24/24) + 1 = | 0 | PT | 24 | 1.0 |
| fers | SU/W = | −.25 | | 60 | | SU/W: | 0 | | 54 | |
| Set- | −12/48 = | | −60/54 + 1 = | −.11 | | SWB: | 0 | −(54/54) + 1 = | 0 | |
| up A | SWB = | −.5 | Q = 20/20 = | 1.0 | | −1(0) = | 0 | Q = 20/20 = | 1 | |
| Q = | −12/24 = | | | 0.9 | | | 0 | | 1 | |
| 20 | | −1.75 | | | | | | | | |
| C8 | M-IDLE | 0 | W-M: | 0 | −1.0 | M-IDLE: | 0 | WM | 30 | −0.75 |
| 24 | PT: | 48 | W-SU: | 12 | +1.5 | PT: | 24 | WSU | 12 | +1.12 |
| Waf- | −(48/24) + 1 = | −1 | PT: | 48 | 0.5 | −(24/24) + 1 = | 0 | PT | 24 | 0.37 |
| ers | SU/W = | 0 | | 48 | | SU/W: | −.5 | | 66 | |
| Set- | 0/24 = | | −(48/48) + 1 = | 0 | | −12/24 = | | −(66/48) + 1 = | −.38 | |
| up B | SWB = | 0 | Q = 30/20 = | 1.5 | | SWB: | −.25 | Q = 30/20 = | 1.5 | |
| Q = | −(0) = | | | 1.5 | | 21/48 = | | | 1.12 | |
| 30 | | −1 | | | | | −0.75 | | | |

-continued

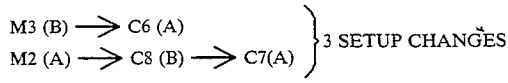
} 3 SETUP CHANGES

PRESENT INVENTION:

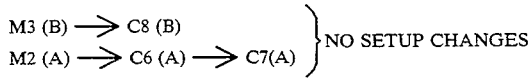
} NO SETUP CHANGES

Example 13 illustrates the comparison between the present invention and a FIFO system, the FIFO system results in three setup changes; namely machine 3 is changed from setup B to setup A for C6; machine 2 is changed from setup A to setup B for lots C8 and then again is changed to setup A for lots C7.

In contrast with the present invention, there are no setup changes. Lot C8 is process on machine 3 which does not require any setup changes and both lots C6 and C7 are processed on machine 2 without changing the setup. Thus, the scheduler of the present invention can control the factory to result in a more efficient scheduling scheme.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A method for generating a schedule for a plurality of lots of a factory;
comprising the steps of:
selecting a predetermined period of time for evaluating a plurality of process resources and said plurality of lots to be processed by said plurality of process resources;
selecting, from said plurality of process resources, a plurality of selected process resources available to process said lots during said predetermined period of time;
selecting, from said plurality of lots, a plurality of selected lots available to be processed by said selected process resources during said predetermined period of time;
determining a process resource score for each of combinations of selected process resources and selected lots;
determining a lot score for each of said combinations of said selected process resources and said selected lots;
combining said lot score and said process resource score for each of said combinations to determine a combination score for each of said combinations of selected process resources and said selected lots;
determining a winning score by comparing each of combination scores for each of said combination of selected process resources and said selected lots;
controlling the process resources within the factory to process the lots in accordance with the winning score.

2. A method for generating a schedule for a plurality of lots of a factory as in claim 1, wherein said method further comprise the step of determining said process resource score based on idle time of each of the process resources for each of said combinations of selected process resources and said selected lots.

3. A method for generating a schedule for a plurality of lots of a factory as in claim 1, wherein said method further comprises the step of determining said process resource score based on machine setup time for each of said combinations of selected process resources and said selected lots.

4. A method for generating a schedule for a plurality of lots of a factory as in claim 1, wherein said method further comprises the step of determining said process resource score based on process time of said process resource for each of said combinations of selected process resources and said selected lots.

5. A method for generating a schedule for a plurality of lots of a factory as in claim 1, wherein the method further comprises the step of determining said lot score based on the time required for said lots to wait for the process resources for each of said combinations of selected process resource and selected lots.

6. A method for generating a schedule for a plurality of lots of a factory as in claim 1, wherein the method further comprises the step of determining a lot score based on queue time of said lots for each of said combinations of said selected process resources and said selected lots.

7. A method for generating a schedule for a plurality of lots of a factory as in claim 1, wherein the method further comprises the step of determining said lot score based on the wait for setup of the process resources for each of said combinations of selected process resources and selected lots.

8. A method for generating a schedule for a plurality of lots of a factory as in claim 1, wherein the method further comprises the step of determining said lot score based on a critical path of the process resources for each of said combinations of selected process resources and selected lots.

9. A method for generating a schedule for a plurality of lots of a factory as in claim 1, wherein the method further comprises the step of determining a process resource score based on wait for switch back time for each of said combinations of said selected process resources and said selected lots.

10. An apparatus for generating a schedule for a plurality of lots of a factory, comprising:
means for selecting a predetermining period of time for evaluating a plurality of process resources and said plurality of lots to be processed by said plurality of process resources;
means for selecting, from said plurality of process resources, a plurality of selected process resources available to process said lots during said predetermined period of time;
means for selecting, from said plurality of lots, a plurality of selected lots available to be processed by said selected process resources during said predetermined period of time;
means for determining a process resource score for each of combinations of said selected process resources and said selected lots;
means for determining a lot score for each of said combinations of selected process resources and said selected lots;
means for combining said lot score and said process resource score for each of said combinations to determine a combined score for each of said combinations of selected process resources and said selected lots; and means for determining a winning score by comparing each of said combined score for each of said combination of selected process resource and said selected lots;

a controller to control said process resources within the factory to process the lots in accordance with the winning score.

11. An apparatus for generating a schedule for a plurality of lots of a factory as in claim 10, wherein said apparatus further comprises means for determining said process resource score based on idle time of said selected process resources for each of said combinations of said selected process resources and said selected lots.

12. An apparatus for generating a schedule for a plurality of lots of a factory as in claim 10, wherein said apparatus further comprises means for determining said process resource score based on machine setup of said selected process resources for each of said combination of said selected process resources and said selected lots.

13. An apparatus for generating a schedule for a plurality of lots of a factory as in claim 10, wherein said apparatus further comprises means for determining a process resource score based on process time of said process resources for each of said combinations of said selected process resources and said selected lots.

14. An apparatus for generating a schedule for a plurality of lots of a factory as in claim 10, wherein said apparatus further comprises means for determining a lot score based on a critical path of said process resources for each of said combinations of said selected process resources and said selected lots.

15. An apparatus for generating a schedule for a plurality of lots of a factory as in claim 10, wherein said apparatus further comprises means for determining a lot score based on the time required to wait for said selected process resources for each of said combinations of selected process resources and said selected lots.

16. An apparatus for generating a schedule for a plurality of lots of a factory as in claim 10, wherein said apparatus further comprises means for determining a lot score based on queue time of the selected lots for each of said combinations of selected process resources and said selected lots.

17. An apparatus for generating a schedule for a plurality of lots of a factory as in claim 10, wherein said apparatus further comprises means for determining a lot score based on wait for setup of said selected processing resources for each of said combinations of selected process resources and said selected lots.

18. An apparatus for generating a schedule for a plurality of lots of a factory as in claim 10, wherein said apparatus further comprises means for determining a process resource score based on wait for switch back time of those selected process resources for each of said combination of selected process resources and said selected lots.

* * * * *